(12) United States Patent
Brewer et al.

(10) Patent No.: US 8,018,734 B2
(45) Date of Patent: Sep. 13, 2011

(54) ELECTRONIC DEVICE AND METHOD OF FORMING SAME

(75) Inventors: Alberto Brewer, Chula Vista, CA (US); Clint Wilber, San Diego, CA (US); Todd Conklin, San Diego, CA (US); Robert Hertlein, San Diego, CA (US)

(73) Assignee: Novatel Wireless, Inc., San Diego, CA (US)

( * ) Notice: Subject to any disclaimer, the term of this patent is extended or adjusted under 35 U.S.C. 154(b) by 0 days.

(21) Appl. No.: 11/844,995

(22) Filed: Aug. 24, 2007

(65) Prior Publication Data

US 2009/0052142 A1   Feb. 26, 2009

(51) Int. Cl.
*H05K 7/14* (2006.01)
*H05K 7/18* (2006.01)
(52) U.S. Cl. .................. 361/800; 361/816; 361/818
(58) Field of Classification Search .................. 361/816, 361/818, 800, 600, 752, 790, 797, 679; 174/35 R, 174/51, 377
See application file for complete search history.

(56) References Cited

U.S. PATENT DOCUMENTS

| | | | |
|---|---|---|---|
| 4,370,700 A | | 1/1983 | Duddles et al. |
| 4,717,989 A | | 1/1988 | De Barros |
| 4,916,575 A | * | 4/1990 | Van Asten ................. 361/715 |
| 5,596,487 A | * | 1/1997 | Castaneda et al. ........... 361/814 |
| 6,049,469 A | | 4/2000 | Hood et al. |
| 6,121,545 A | | 9/2000 | Peng et al. |
| 6,392,900 B1 | | 5/2002 | Petty et al. |
| 6,524,120 B2 | | 2/2003 | Zhao |
| 6,819,562 B2 | * | 11/2004 | Boudreaux et al. .......... 361/690 |
| 7,155,258 B1 | | 12/2006 | Cisar |
| 7,245,497 B2 | * | 7/2007 | Klein et al. ................... 361/752 |
| 7,247,032 B2 | | 7/2007 | Merz |
| 7,372,701 B2 | | 5/2008 | Jacobson et al. |
| 2004/0014336 A1 | | 1/2004 | Merz |
| 2005/0162842 A1 | | 7/2005 | Muramatsu et al. |

FOREIGN PATENT DOCUMENTS

| | | |
|---|---|---|
| EP | 0394053 A1 | 10/1990 |
| EP | 1248507 A1 | 10/2002 |

OTHER PUBLICATIONS

International Search Report for PCT Application No. PCT/US2008/074054.
Supplementary European Search Report for European Application No. 08 828 131.6-1242, Jan. 20, 2011.

* cited by examiner

*Primary Examiner* — Hung S Bui
(74) *Attorney, Agent, or Firm* — AlbertDhand LLP

(57) ABSTRACT

An electronic device includes a first printed circuit board including electronic components, a second printed circuit board including electronic components, and a shielding midframe. The shielding midframe is adapted to provide electromagnetic isolation between the first printed circuit board and the second printed circuit board. The shielding midframe is further adapted to provide electromagnetic isolation of electronic components on at least one of the first printed circuit or the second printed circuit.

26 Claims, 8 Drawing Sheets

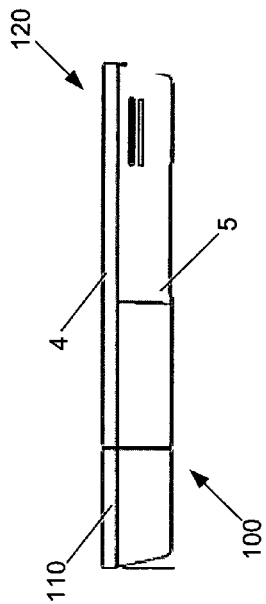
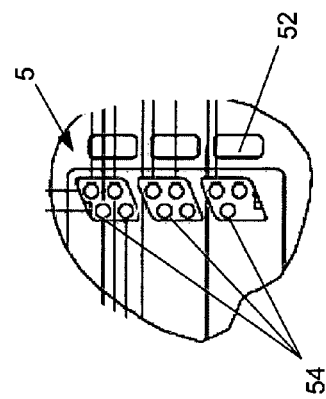
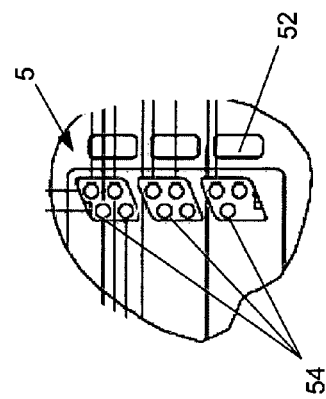
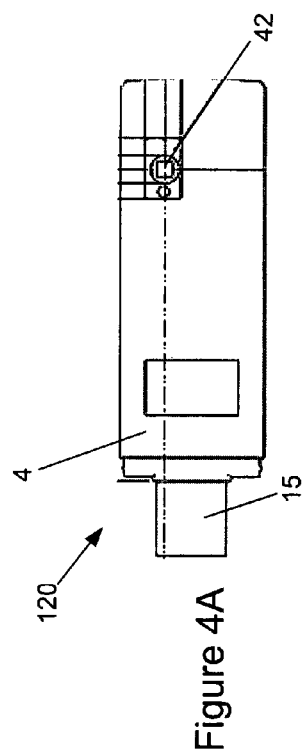
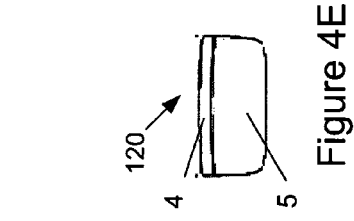
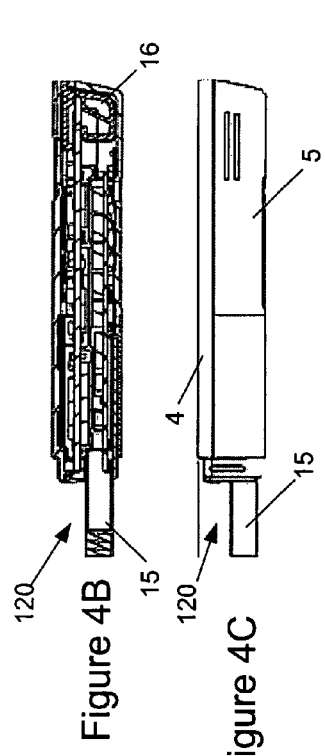
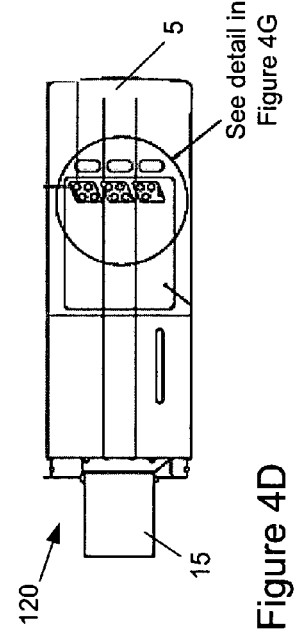
Figure 4A
Figure 4B
Figure 4C
Figure 4D
Figure 4E
Figure 4F
Figure 4G

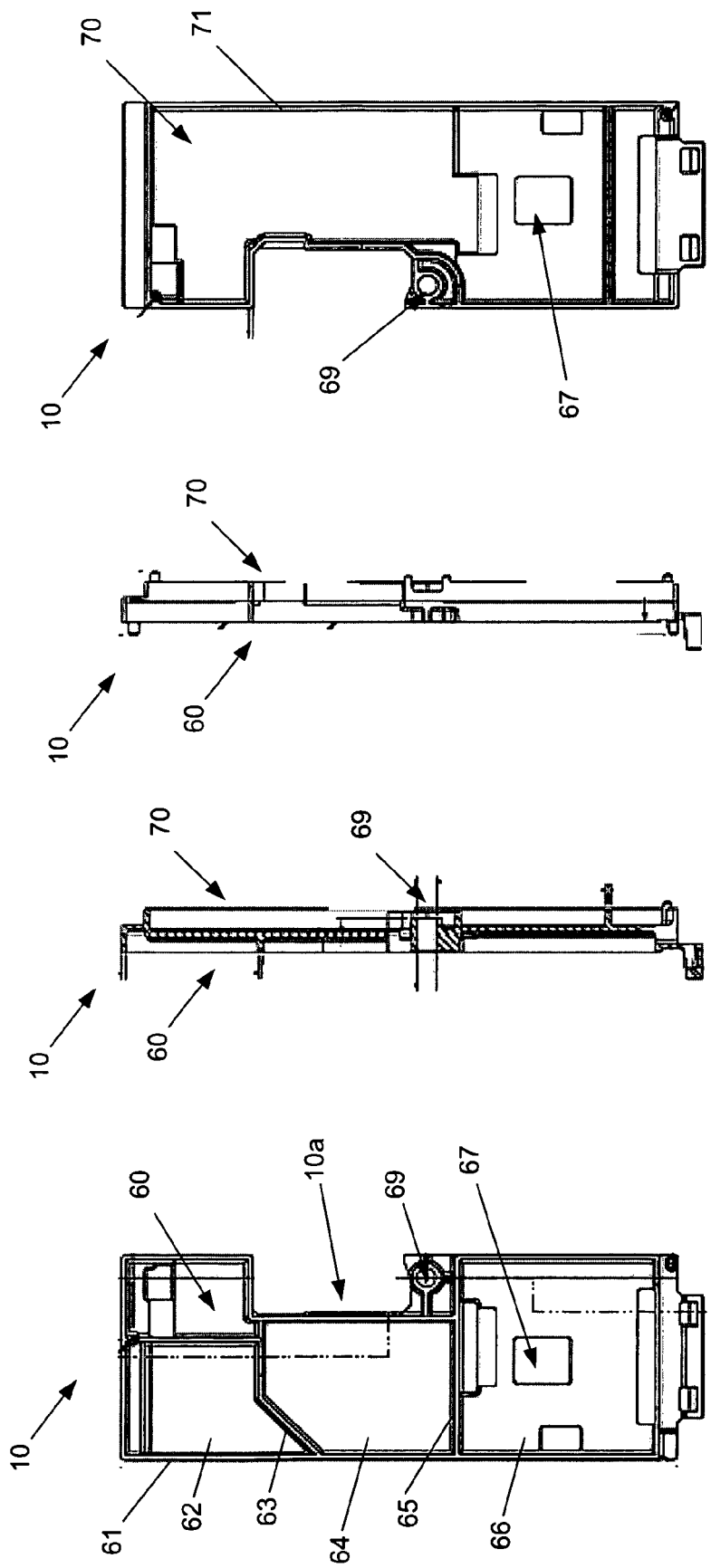

ELECTRONIC DEVICE AND METHOD OF FORMING SAME

BACKGROUND OF THE INVENTION

The present invention relates generally to the field of electronic devices and, more particularly, to the field of electronic devices with printed circuit boards that generate heat.

There is a general desire to reduce the size or footprint of electronic devices, such as wireless modems. The extent to which the size of such devices may be reduced is limited by several factors. For example, such devices typically include electronic components which generate heat. Reduction in size generally impacts the ability of the device to dissipate the generated heat. Further, in order to avoid interference, particularly electromagnetic interference, the electronic components in such devices must be maintained at a certain distance from other components. Thus, the extent to which the size of such devices may be reduced is further limited.

SUMMARY OF THE INVENTION

One aspect of the invention relates to an electronic device. The electronic device includes a first printed circuit board including electronic components, a second printed circuit board including electronic components, and a shielding midframe. The shielding midframe is adapted to provide electromagnetic isolation between the first printed circuit board and the second printed circuit board. The shielding midframe is further adapted to provide electromagnetic isolation of electronic components on at least one of the first printed circuit or the second printed circuit.

In one embodiment, the first and second printed circuit boards are stacked with the shielding midframe positioned therebetween.

The shielding midframe may be adapted to provide distribution or dissipation of heat generated by at least one electronic component.

In one embodiment, the shielding midframe includes a first side with at least one cavity to accommodate electronic components of the first printed circuit board and a second side with at least one cavity to accommodate electronic components of the second printed circuit board. Each cavity may be electromagnetically isolated from each other cavity.

In one embodiment, the electronic device further includes a housing adapted to secure therewithin the first and second printed circuit boards and the shielding midframe. The housing may include a metal insert for transfer of heat from the printed circuit board.

In one embodiment, the electronic device further includes a heat spreader positioned between at least one of the printed circuit boards and the housing. The heat spreader may be adapted to distribute heat from the printed circuit board to the housing.

The housing may be formed of an extruded plastic and an amorphous alloy.

In one embodiment, the electronic device further includes a heat transfer unit adapted to transfer heat between the first printed circuit board and the second printed circuit board. The heat transfer unit may be a screw adapted to secure the first printed circuit board and the second printed circuit board to the shielding midframe.

In one embodiment, at least one component of the first circuit board is coupled to at least one component of the second circuit board.

In one embodiment, the electronic device further includes at least one snap-on antenna and a diversity antenna to provide wireless communication by at least one of the printed circuit boards.

The shielding midframe may be formed of a metal. In one embodiment, the shielding midframe is formed of an amorphous alloy.

The shielding midframe may also provide structural rigidity.

In one embodiment, the electronic device further includes a connector adapted to provide interfacing of at least one of the printed circuit boards with a communication device. The connector may be a universal serial bus (USB) connector. At least one of the printed circuit boards may provide modem capabilities for the communication device.

In another aspect of the invention, a method for forming an electronic device includes positioning a shielding midframe to provide electromagnetic isolation between a first printed circuit board and a second printed circuit board. The first printed circuit board includes electronic components, and the second printed circuit board includes electronic components. The shielding midframe is further adapted to provide electromagnetic isolation of electronic components on at least one of the first printed circuit or the second printed circuit.

In another aspect, the invention relates to a modem device. The modem device includes a first printed circuit board including electronic components, a second printed circuit board including electronic components, an antenna positioned on the first printed circuit board or the second printed circuit board, and a shielding midframe. The shielding midframe is adapted to provide electromagnetic isolation between the first printed circuit board and the second printed circuit board, the shielding midframe being further adapted to provide electromagnetic isolation of electronic components on at least one of the first printed circuit or the second printed circuit.

BRIEF DESCRIPTION OF THE DRAWINGS

FIGS. 4A-4G illustrate various views of the electronic device according to an embodiment of the present invention;

FIGS. 6A-6D illustrate various views of the shielding midframe of FIGS. 5A and 5B.

DETAILED DESCRIPTION OF THE PREFERRED EMBODIMENTS

Figure 1A:
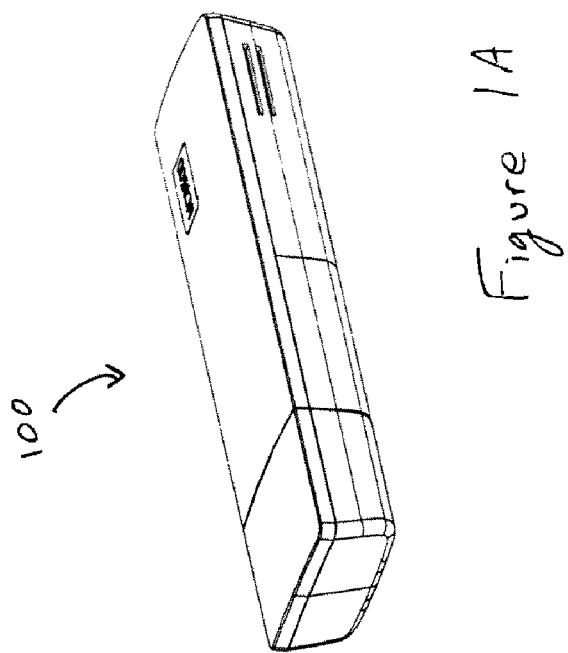
FIGS. 1A and 1B are perspective illustrations of an electronic device according to an embodiment of the present invention.
Figure 1B:
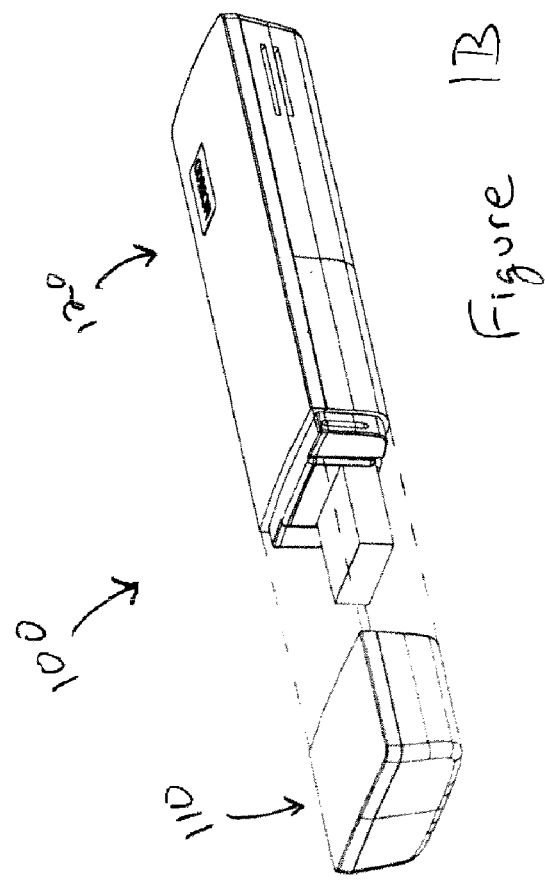

Referring to FIGS. 1A and 1B, an electronic device according to an embodiment of the present invention is illustrated. The electronic device 100 may be any type of electronic device with electronic components therein. In the illustrated embodiment, the electronic device 100 is a modem device adapted to provide wireless communication.

The electronic device 100 includes a main body 120 and a cap 110. FIG. 1A illustrates the electronic device 100 in the closed position with the cap covering an end of the main body, while FIG. 1B illustrates the electronic device 100 in an open position with an end of the main body 120 exposed. The main body 120 includes various electronic components (described below), as well as a connector for coupling the electronic device 100 with another device, such as a communication device. The communication device may be, for example, a desktop computer, a laptop computer, a portable phone, a personal digital assistant (PDA) or the like.

Figure 2:
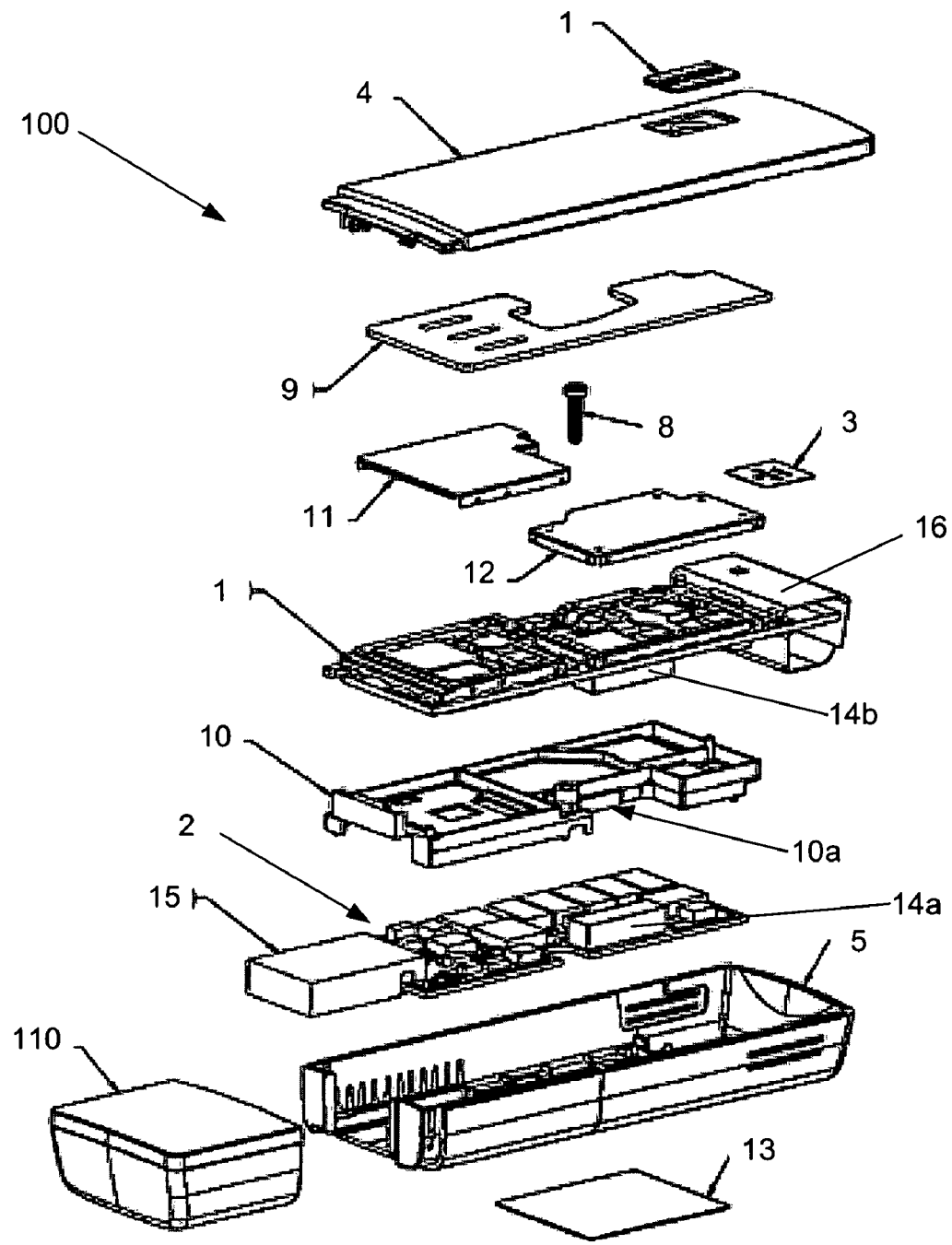
FIG. 2 is an exploded illustration of the electronic device of FIGS. 1A and 1B.

Referring now to FIG. 2, an exploded illustration of the electronic device 100 is provided. The electronic device 100, such as the illustrated wireless modem device, is advantageously configured to have a reduced size. In the illustrated embodiment, the reduced size is achieved by positioning the electronic components a first printed circuit board (PCB) 1 and on a second PCB 2 and positioning the two PCB's 1, 2 in a stacked configuration. The embodiment illustrated in the figures includes two stacked PCB's. Those with skill in the art will understand that any practical number of PCB's may be stacked. Further, in addition to be stacked, the PCB's may be positioned in various other configurations to reduce the size or footprint of the electronic device 100. Such variations are contemplated within the scope of the present invention.

The electronic components on the PCB's 1, 2 may include all components necessary for electronic operation of the electronic device 100. For example, the first PCB 1 may include a power module and one or more antennas 16. The antennas 16 may include a snap-on antenna and a diversity antenna.

Similarly, the second PCB 2 may include various components such as a processor configured for operation of the electronic device 100. In the illustrated embodiment, the second PCB 2 is provided with a connector 15 for interfacing the electronic device 100 with another communication device (not shown). In this regard, when interfaced with another communication device, the electronic device 100 provides wireless communication capability to allow the communication device to communicate with, for example, a network such as a wireless local area network (WLAN), a cellular network or another device. In the illustrated embodiment, the connector 15 is a universal serial bus (USB) connector.

To prevent or reduce interference between the electronic components on the two PCB's 1, 2, a shielding midframe 10 is positioned between the first PCB 1 and the second PCB 2. The shielding midframe is adapted to provide electromagnetic isolation between the electronic components on the first PCB 1 and those on the second PCB 2. Further, the shielding midframe 10 is adapted to provide electromagnetic isolation of electronic components on the same PCB. For example, the shielding midframe 10 is adapted to provide electromagnetic isolation of one electronic component on the first PCB 1 from another electronic component on the first PCB 1. An embodiment of the shielding midframe 10 is described below in greater detail with reference to FIGS. 5A-7.

For operation of the electronic device 100, communication may be required between the different PCB's 1, 2. In this regard, the first PCB 1 and the second PCB 2 are provided with connectors 14a, 14b adapted to engage each other. The connectors 14a, 14b may be male and female counterparts of pin connector arrangement, for example. To allow engagement of the connectors 14a, 14b, the shielding midframe 10 may be provided with a contour 10a. Thus, the connectors 14a, 14b engage each other through the contour 10a of the shielding midframe 10. Further, additional openings may be provided within the shielding midframe 10 for electronic coupling of the first and second PCB's 1, 2, while maintaining electromagnetic isolation of the various components. Thus, at least one electronic component of the first PCB 1 is coupled to at least one electronic component of the second PCB 2.

During operation of the electronic device 100, one or more electronic components of the electronic device 100 may generate heat. The heat may be generated either continuously or in short bursts, as may occur when a modem is transmitting or receiving signals. Over time, this heat may cause the temperature within the electronic device 100 to increase to a level which may damage or disrupt operation of one or more electronic components.

In this regard, the shielding midframe 10 may be adapted to facilitate dissipation or distribution of heat. For example, the shielding midframe 10 may absorb at least some of the heat for dissipation over time. Thus, when heat is generated in short bursts, the shielding midframe 10 may absorb the heat during these short periods of operation. The shielding midframe may then dissipate the heat outside these periods.

Further, the shielding midframe 10 may direct, or distribute, the heat to various other portions of the electronic device 100 for dissipation to the external environment. In this regard, the shielding midframe 10 may serve as a conduit for heat from the electronic components to, for example, housing components 4, 5 of the electronic device 100.

The housing components 4, 5 are provided to secure the first PCB 1, the second PCB 2, the shielding midframe 10 and other components of the electronic device 100 secured within the housing components 4, 5.

In addition, the housing components 4, 5 may include components for facilitating dissipation of heat. In one embodiment, the housing components 4, 5 are formed of an extruded plastic material and may be formed in a mold, for example. Additionally, a metal insert may be provided in the housing lower housing component 5. The metal insert may be formed of a variety of materials. In one embodiment, the metal insert is formed of an amorphous alloy, such as Liquidmetal®. In this regard, the metal insert may be formed using a mold, resulting in reduced manufacturing costs by eliminating the need for machining.

Thus, heat may be distributed from the electronic components by the shielding midframe 10 to the housing component 5. The metal insert of the housing component 5 may then allow for dissipation of the heat to the external environment.

In certain embodiments, various electronic components of the PCB's 1, 2 may also require electromagnetic isolation from the outside environment. For example, in the illustrated embodiment, electronic components on the first PCB 1 may require electromagnetic isolation from the outside environment. To facilitate such isolation, shielding lids 11, 12 are provided on the opposite side of the first PCB 1 from the shielding midframe 10. The shielding lids 11, 12 may be made of the same or different materials as the shielding midframe 10.

In the illustrated embodiment, the electronic device 100 includes a fastener 8, such as a screw, to secure the first PCB 1, the second PCB 2 and the shielding midframe 10 to each other. The fastener 8 may also secure the PCB's 1, 2 and the shielding midframe 10 to the lower housing component 5. The fastener 8 is preferably made of a metal material. In this regard, the fastener 8 may also function as a heat transfer unit for transferring heat between the first PCB 1, the second PCB 2 and the shielding midframe 10.

A heat spreader 9 is provided between the first PCB 1, with the shielding lids 11, 12, and the upper housing component 4. The heat spreader 9 functions to distribute heat from the PCB's 1, 2 substantially across the entire surface of the upper housing component 4. In this regard, additional heat is dissipated through the surface of the upper housing component 4. Further, excess heat from the second PCB 2, may be transferred through the fastener 8 to the heat spreader 9 for dissipation through the upper housing component 4. Thus, the fastener 8 functions as a heat transfer unit for transferring heat from the PCB's 1, 2 and the shielding midframe 10 to an outside surface, such as the housing component 4. The heat spreader 9 may be shaped as desired to make contact with certain regions and avoid contact with other regions of the PCB, for example.

The electronic device 100 may also include labels 7, 13 to cover various openings in the housing components 4, 5, as described in greater detail below with reference to FIGS. 4A-4G.

Figure 3A:
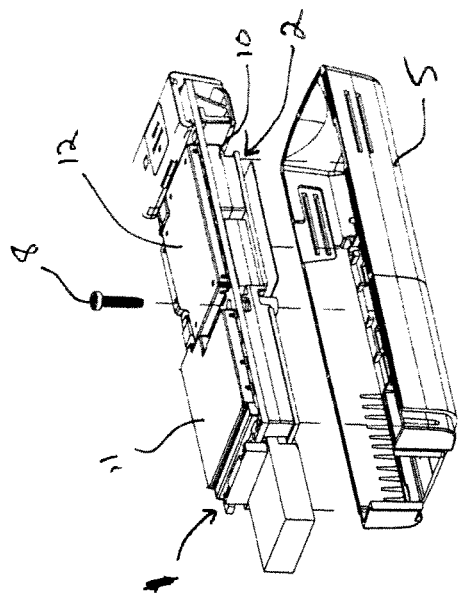
FIGS. 3A-3F illustrate the assembly of the electronic device according to an embodiment of the present invention.

Referring now to FIGS. 3A-3F, the assembly of the electronic device according to an embodiment of the present invention is illustrated. Referring first to FIG. 3A, the shielding midframe 10 is positioned to provide electromagnetic isolation between the first PCB 1 and the second PCB 2. As noted above, the shielding midframe 10 may also provide electromagnetic isolation of electronic components on the same PCB. The PCB's 1, 2 and the midframe are secured, in part, by engagement of the connectors 14a, 14b of the PCB's 1, 2. As noted above, the connectors 14a, 14b engage each other through contour 10a of the shielding midframe 10.

Figure 3B:
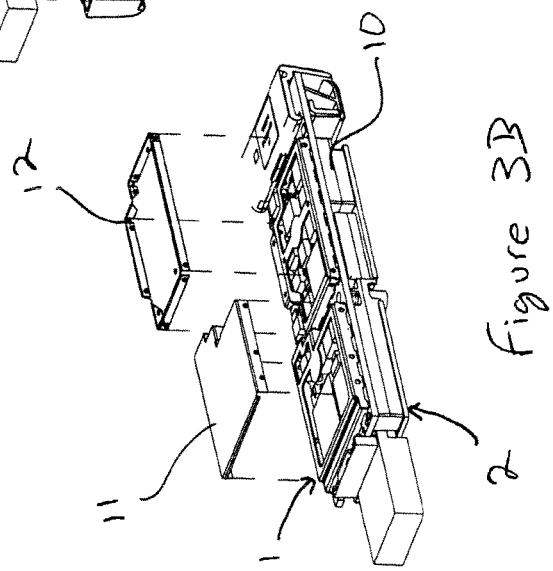

Next, as illustrated in FIG. 3B, the shielding lids 11, 12 may be positioned above the various electronic components of the first PCB 1. The shielding lids 11, 12 provide electromagnetic shielding for the electronic components from the outside environment.

Figure 3C:
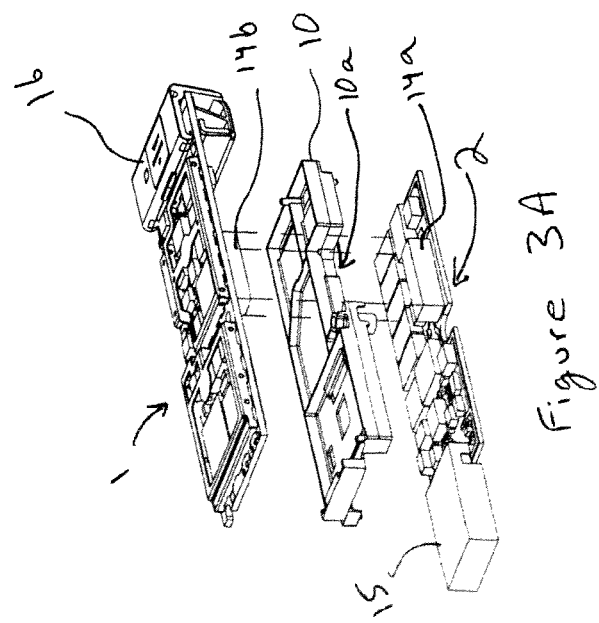
Figure 3F:
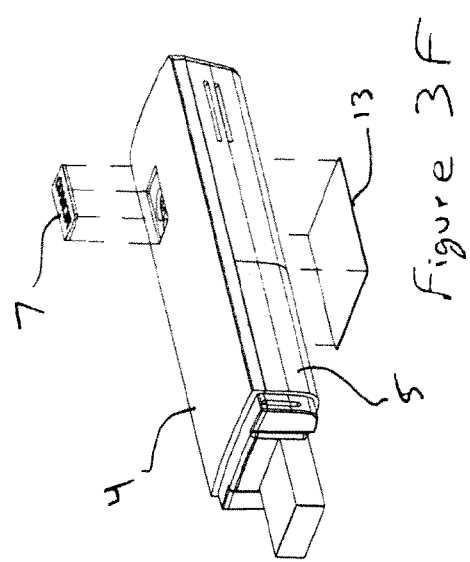
Figure 3E:
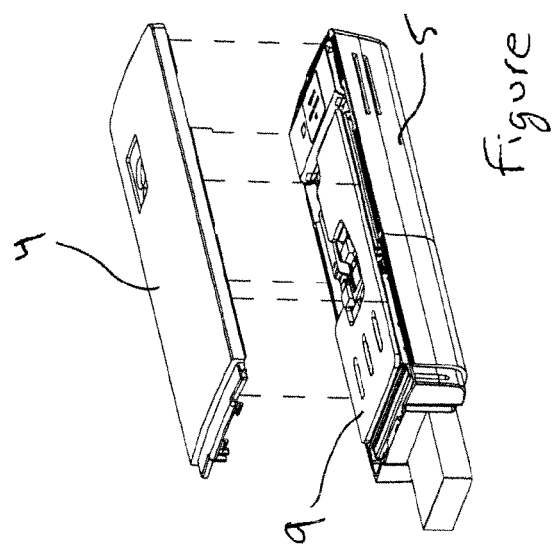
Figure 3D:
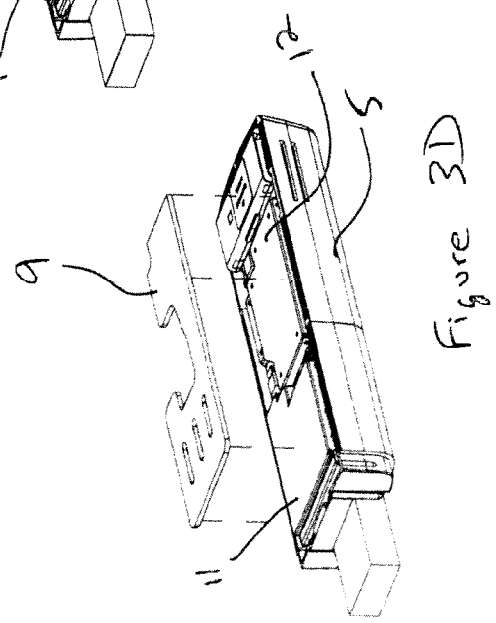

Referring now to FIG. 3C, the PCB's 1, 2 and the shielding midframe 10 are secured to each other and the lower housing component 5 by the fastener 8. Next, the hat spreader 9 is positioned (see FIG. 3D), and the upper housing component 4 is secured to the lower housing component 5. The housing components 4, 5 may be secured to each other in a variety of manners, including by way of notches and corresponding slots formed on the housing components 4, 5. Finally, following any necessary testing or configuration of the electronic device, labels 7, 13 are placed to cover holes in the housing. The holes are described below in greater detail with reference to FIGS. 4A-4G.

Referring now to FIGS. 4A-4G, various views of the electronic device 100 according to an embodiment of the present invention are illustrated. FIG. 4A illustrates a top view of the electronic device 100 with the cap 110 removed. Additionally, the label 7 is not shown to illustrate the hole 42 in the upper housing component 4. The hole 42 is provided for testing of the electronic device 100. In the case of a wireless modem, the hole provides for connection of an antenna test box to facilitate testing of the electronic device 100.

Referring now to FIG. 4D, a view of the bottom of the electronic device 100 with the cap 110 removed is illustrated. Again, the label 13 is not shown to illustrate the openings in the lower housing component 5. FIG. 4G shows the region of the opening in greater detail. The lower housing component 5 is provided with two sets of openings. The first set of opening 52 provide ventilation of the electronic device 100. In this regard, the ventilation may be passive. Additionally, a second set of openings 54 is provided to facilitate configuration (or reconfiguration) of the electronic device. For example, the set of openings 54 may be opening for Joint Test Action Group (JTAG) pins. The set of openings 54 may allow for configuration of the modem device for specific uses, for example.

Figure 5A:
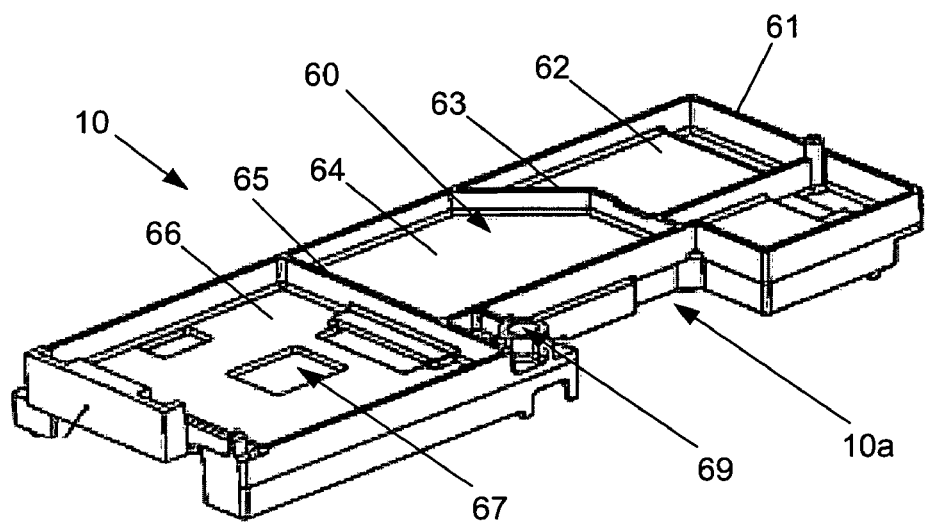
FIG. 5A illustrates an isometric view of the top of a shielding midframe for use with an electronic device according to an embodiment of the present invention.
Figure 5B:
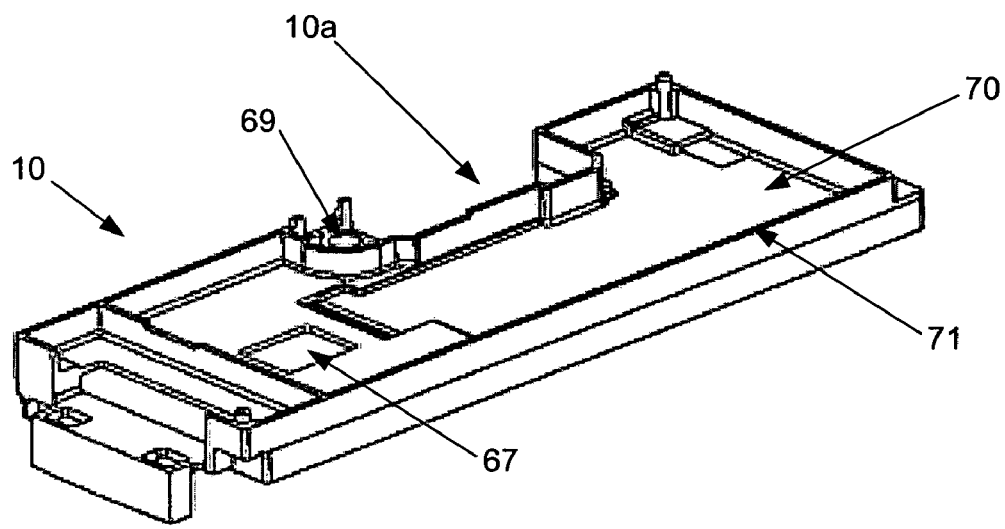
FIG. 5B illustrates an isometric view of the bottom of the shielding midframe of FIG. 5A.

Referring now to FIG. 5A-6D, various views of the shielding midframe 10 according to an embodiment of the present invention are illustrated. FIG. 5A is an isometric view of the top of the shielding midframe 10 illustrating a first side 60 of the shielding midframe 10, while FIG. 5B is an isometric view of the bottom of the shielding midframe 10 illustrating a second side 70 of the shielding midframe 10. The first side 60 is provided with a plurality of cavities 62, 64, 66 for accommodating electronic components therein. The electronic components housed in the cavities 62, 64, 66 are electromagnetically isolated from any components on the second side 70 of the shielding midframe 10. Similarly, the second side 70 is provided with a cavity to accommodate electronic components therein. Although only the first side 60 of the illustrated embodiment is provided with multiple cavities 62, 64, 66, it is contemplated that each side 60, 70 may be provided with multiple cavities.

Each of the first side 60 and the second side 70 is provided with an outer wall 61, 71, respectively, to facilitate shielding of the electronic components. Additionally, the first side 60 is provided with internal walls 63, 65 to provide electromagnetic isolation of the components in adjacent cavities 62, 64, 66. Thus, electronic components on the same PCB (on the same side of the shielding midframe 10) are electromagnetically isolated from each other.

As noted above, the shielding midframe 10 is provided with a contour 10a to facilitate any desired coupling of components or PCB's on opposite sides of the shielding midframe 10. Further coupling may be achieved through openings, such as opening 67, in the interior of the shielding midframe 10. Also, a through hole 69 is provided for the fastener described above for fastening of the PCB's and the midframe to each other and/or to the housing component.

The shielding midframe 10 may be formed of any of a number of materials, such as metals. In one embodiment, the shielding midframe is formed of an amorphous alloy, such as Liquidmetal®. In this regard, a mold may be used to repeatedly form the shielding midframe to high tolerances. Thus, the use of amorphous alloys allows for the formation of a shielding midframe to high tolerances without the need for costly and time-consuming machining of metal.

In addition to the electromagnetic isolation and the heat dissipation/distribution, the shielding midframe 10 may also provide desired rigidity to the electronic device. Such devices are often used by plugging into other devices and can remain vulnerable and fragile. The use of the midframe with the stacked configuration of the PCB's provides for a more stable and rigid structure.

Figure 7:
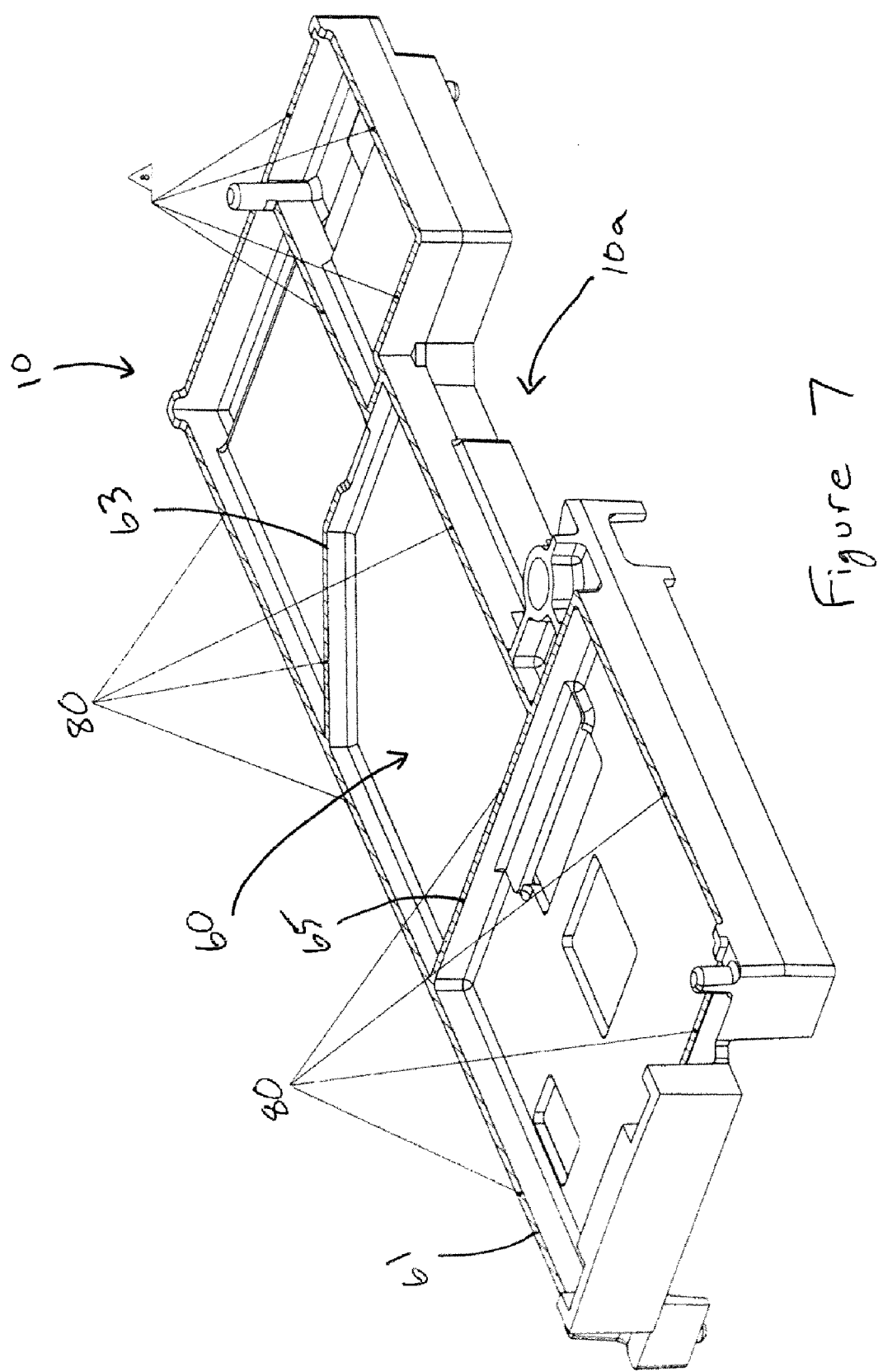
FIG. 7 illustrates an isometric view of the shielding midframe with a conductive sealant according to an embodiment of the present invention.

Referring now to FIG. 7, an isometric view of the shielding midframe 10 is illustrated with a conductive sealant provided on the edge of the walls 61, 63, 65. Similar conductive sealant may be formed on the wall 71 on the second side of the shielding midframe. In one embodiment, the conductive sealant is conductive silicone. Use of the conductive sealant can prevent current leakage from the electronic components of the PCB's. Such leakage may occur with repeated heating and cooling of the electronic device. Since the shielding midframe 10 and the PCB's may not expand and contract at the same rates during such heating and cooling periods, a separation between them may occur. The conductive sealant can seal any such separation.

The foregoing description of embodiments of the present invention have been presented for purposes of illustration and description. It is not intended to be exhaustive or to limit the present invention to the precise form disclosed, and modifications and variations are possible in light of the above teachings or may be acquired from practice of the present invention. The embodiments were chosen and described in order to explain the principles of the present invention and its practical application to enable one skilled in the art to utilize the present invention in various embodiments and with various modifications as are suited to the particular use contemplated.

What is claimed is:

1. An electronic device, comprising:
a first printed circuit board including electronic components;
a second printed circuit board including electronic components; and
a shielding midframe configured to provide electromagnetic isolation between the first printed circuit board and the second printed circuit board, the shielding midframe having at least one side with two or more cavities, the two or more cavities being separated by internal walls for providing electromagnetic isolation between electronic components on a printed circuit on the at least one side of the shielding midframe.

2. The electronic device of claim 1, wherein the first and second printed circuit boards are stacked with the shielding midframe positioned therebetween.

3. The electronic device of claim 2, wherein the shielding midframe is configured to provide distribution of heat generated by at least one electronic component.

4. The electronic device of claim 2, wherein the shielding midframe is configured to provide dissipation of heat generated by at least one electronic component.

5. The electronic device of claim 1, wherein the shielding midframe is configured to provide distribution of heat generated by at least one electronic component.

6. The electronic device of claim 1, wherein the shielding midframe is configured to provide dissipation of heat generated by at least one electronic component.

7. The electronic device of claim 1, further comprising:
a housing configured to secure therewithin the first and second printed circuit boards and the shielding midframe.

8. The electronic device of claim 7, wherein the housing includes a metal insert for transfer of heat from the printed circuit board.

9. The electronic device of claim 7, further comprising:
a heat spreader positioned between at least one of the printed circuit boards and the housing, the heat spreader being configured to distribute heat from the printed circuit board to the housing.

10. The electronic device of claim 7, wherein the housing is formed of an extruded plastic and an amorphous alloy.

11. The electronic device of claim 1, wherein at least one component of the first circuit board is coupled to at least one component of the second circuit board.

12. The electronic device of claim 1, further comprising:
at least one snap-on antenna and a diversity antenna to provide wireless communication by at least one of the printed circuit boards.

13. The electronic device of claim 1, wherein the shielding midframe is formed of a metal.

14. The electronic device of claim 1, wherein the shielding midframe is formed of an amorphous alloy.

15. The electronic device of claim 1, wherein the shielding midframe provides structural rigidity.

16. The electronic device of claim 1, further comprising:
a connector configured to provide interfacing of at least one of the printed circuit boards with a communication device.

17. The electronic device of claim 16, wherein the connector is a universal serial bus (USB) connector.

18. The electronic device of claim 16, wherein at least one of the printed circuit boards provides modem capabilities for the communication device.

19. The electronic device of claim 1, further comprising:
a conductive sealant configured to provide to prevent current leakage between the shielding midframe and at least one of the printed circuit boards.

20. The electronic device of claim 1, further comprising:
a heat transfer unit configured to transfer heat between the first printed circuit board and the second printed circuit board.

21. The electronic device of claim 20, wherein the heat transfer unit is a screw configured to secure the first printed circuit board and the second printed circuit board to the shielding midframe.

22. The electronic device of claim 21, wherein the screw is further configured to secure the first printed circuit board, the second printed circuit board and the shielding midframe to a housing for the electronic device.

23. The electronic device of claim 20, wherein the heat transfer unit is configured to transfer heat from the shielding midframe and one or more printed circuit boards to an outside environment.

24. A method for forming an electronic device, comprising:
positioning a shielding midframe to provide electromagnetic isolation between a first printed circuit board and a second printed circuit board,
wherein the first printed circuit board includes electronic components,
wherein the second printed circuit board includes electronic components, and
wherein the shielding midframe comprises at least one side with two or more cavities, the two or more cavities being separated by internal walls for providing electromagnetic isolation between electronic components on a printed circuit on the at least one side of the shielding midframe.

25. The method of claim 24, wherein the shielding midframe is configured to provide distribution of heat generated by at least one electronic component.

26. A modem device, comprising:
a first printed circuit board including electronic components;
a second printed circuit board including electronic components;
an antenna positioned on the first printed circuit board or the second printed circuit board; and
a shielding midframe configured to provide electromagnetic isolation between the first printed circuit board and the second printed circuit board, the shielding midframe having at least one side with two or more cavities, the two or more cavities being separated by internal walls for providing electromagnetic isolation between electronic components on a printed circuit on the at least one side of the shielding midframe.

* * * * *